United States Patent [19]

Wouda et al.

[11] Patent Number: 4,817,081
[45] Date of Patent: Mar. 28, 1989

[54] ADAPTIVE FILTER FOR PRODUCING AN ECHO CANCELLATION SIGNAL IN A TRANSCEIVER SYSTEM FOR DUPLEX DIGITAL COMMUNICATION THROUGH ONE SINGLE PAIR OF CONDUCTORS

[75] Inventors: Kornelis J. Wouda; Simon J. M. Tol, both of Eindhoven, Netherlands

[73] Assignee: AT&T and Philips Telecommunications B.V., Hilversum, Netherlands

[21] Appl. No.: 28,634

[22] Filed: Mar. 20, 1987

[30] Foreign Application Priority Data

Mar. 28, 1986 [NL] Netherlands .................. 8600817

[51] Int. Cl.⁴ ............................................. H04B 3/23
[52] U.S. Cl. ..................................... 370/321; 379/411
[58] Field of Search ............... 370/32.1, 32; 379/406, 379/410, 411

[56] References Cited

U.S. PATENT DOCUMENTS

| | | | |
|---|---|---|---|
| 3,647,992 | 3/1972 | Thomas | 370/32.1 X |
| 4,464,746 | 8/1984 | Snijders et al. | 370/32.1 |
| 4,571,719 | 2/1986 | Carlquist et al. | 370/32.1 |
| 4,605,826 | 8/1986 | Kanemasa | 379/32.1 |
| 4,669,116 | 5/1987 | Agazzi et al. | 379/411 |

FOREIGN PATENT DOCUMENTS

| | | | |
|---|---|---|---|
| 0137508 | 4/1985 | European Pat. Off. | 379/410 |
| 0223928 | 12/1983 | Japan | 370/32.1 |
| 0107928 | 6/1985 | Japan | 370/32.1 |

OTHER PUBLICATIONS

"A TAP Selection Algorithm for Adaptive Filters", S. Kawamura et al., ICASSP 86, Tokyo, 1986 IEEE.
"A Single-Chip VLSI Echo Canceler", D. L. Duttweiler et al., Bell Systems Tech. Journal, Feb. 1980, vol. 59, No. 2, pp. 149–160.

*Primary Examiner*—Jin F. Ng
*Assistant Examiner*—Randall S. Vaas
*Attorney, Agent, or Firm*—Lucian C. Canepa

[57] ABSTRACT

Adaptive filter for producing an echo cancellation signal in a transceiver system arranged for digital communication in the duplex mode via one single pair of conductors, the filter comprising delay means (8) having N terminals for delaying the N most recently transmitted symbols, an addressing circuit (10) having M input terminals (M<N), each of which is coupled to the terminals 1 to M of the delay means, the addressing circuit forming from the signals applied to the input terminals an address for a memory (11) in which for each of these addresses always a first correction signal is stored; a weighting and summing arrangement (9) having N input terminals coupled to the N terminals of the delay means, the arrangement providing a second correction signal which is a weighted sum of all the signals at the input terminals thereof, means (12) for adding together the first correction signal and the second correction signal and an adaptive control loop (13).

1 Claim, 1 Drawing Sheet

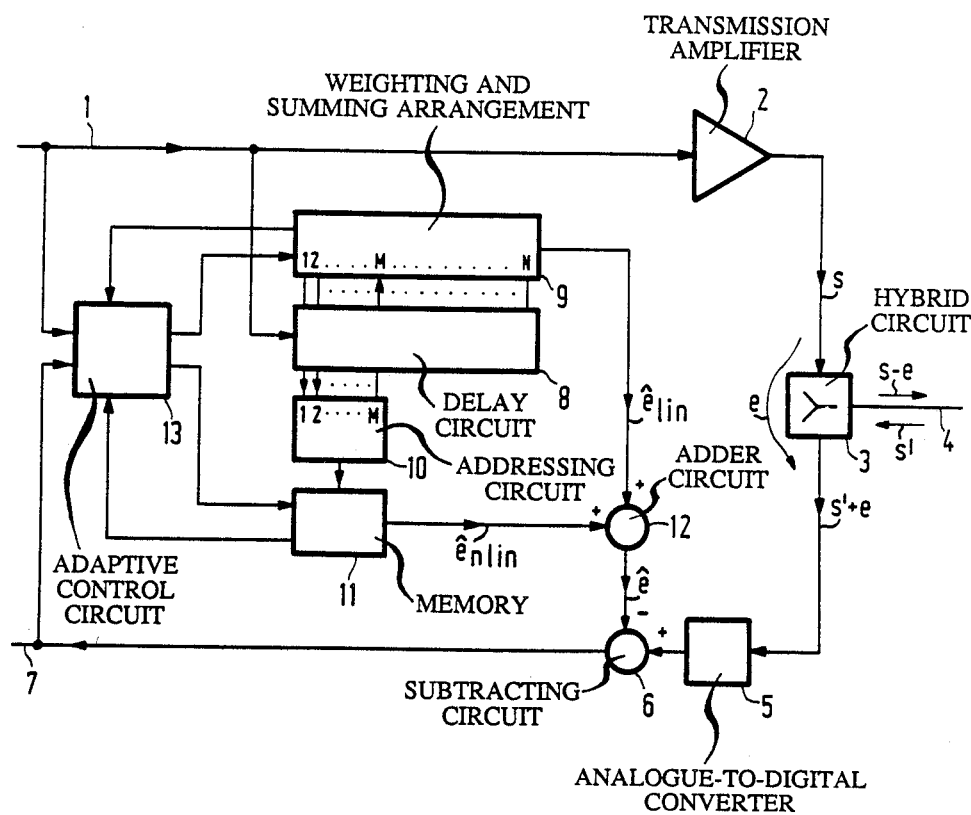

ADAPTIVE FILTER FOR PRODUCING AN ECHO CANCELLATION SIGNAL IN A TRANSCEIVER SYSTEM FOR DUPLEX DIGITAL COMMUNICATION THROUGH ONE SINGLE PAIR OF CONDUCTORS

The invention relates to an adaptive filter for producing an echo cancellation signal in a transceiver system arranged for duplex digital communication through one single pair of conductors, the filter comprising delay means for receiving and delaying the N most recently transmitted symbols, an addressing circuit coupled to the delay means for always applying to the addressing circuit the non-delayed and at least one of a predetermined first sequence of delayed versions of the most recently transmitted symbols, the addressing circuit being arranged for forming from the applied signals an address for a memory which is coupled to the addressing circuit and in which always a first correction signal is stored for each of these addresses, a weighting and summing arrangement coupled to the delay means for always applying to the weighting and summing arrangement the non-delayed and, from a predetermined second sequence, delayed versions of the most recently transmitted symbols, the weighting and summing arrangement being arranged for multiplying each signal applied thereto by a predetermined specific coefficient for providing a second correction signal which is the sum of all the signals applied thereto multiplied by the specific coefficients, means for adding together the first correction signal and the second correction signal and means for adaptively controlling the coefficients in the weighting and summing arrangement and the correction values in the memory.

For digital transmission in two directions through a two-wire link the use of an echo canceller is imperative since the signal at the input of a receiver used in such a two-wire link contains a strong echo component produced by the transmit signal of the transmitter associated with the receiver. By reducing the received signal by a signal which is a closest possible approximation of the fraction, present in the received signal, of the signal transmitted by its own transmitter, commonly referred to as the echo signal, it is possible to derive from the received signal the actually received signal, in spite of the strong echo component present in the received signal. In echo cancellers of such a type, use can be made of a filter which is capable of compensating for any linear combination of transmitted, preceding symbols, a what is commonly referred to as a transversal filter. This mode of echo cancellation is extensively described in N. A. M. Verhoeckx et al.: "Digital echo cancellation for baseband data transmission", IEEE Trans. ASSP, Vol. ASSP-27, no. 6, December 1979, pages 768–781. However, a nonlinear transmission characteristic in the signal path between the transmitter and the receiver cannot be compensated for by the transversal filter and produces residual errors of such a value that an adequate echo cancellation is not possible.

U.S. Pat. No. 4,237,463 discloses an echo canceller comprising an adaptive control loop, in which use is made of a memory in which a table is stored having a specific correction value in the table for any possible combination of symbols transmitted during a predetermined, preceding period of time. Using such an echo canceller it is indeed possible to compensate for non-linearities, as the correction signal need not be linearly connected with the sequence of previously transmitted symbols. Such an echo canceller has however the disadvantage that the adaptive control needs a significantly longer period of time to arrive at an appropriate compensation value than when a transversal filter is used, because any arbitrary value in the table is read only at a very low rate and is then only corrected via the adaptive control loop.

A further drawback of the use of a table with correction values is that in view of the wide amplitude range the correction values must be capable of covering, a large storage capacity is required, which requires a large chip surface area and increases the cost price of the chip, whilst in addition the number of rejects during manufacture is higher for chips having a large surface area.

European Patent Specification No. 0092569 describes an adaptive filter of the type defined in the opening paragraph, it being possible to compensate also for a non-linear component in the echo signal in addition to a compensation of the linear component. For that purpose, the adaptive filter is split into a first and a second portion, the first portion producing an echo cancellation signal for the most recently transmitted symbols and to that end includes a table with correction values, whilst the second portion produces an echo cancellation signal for the symbols which were transmitted a longer period of time ago, and to that end includes a transversal filter. The basic idea is that, because of the most recently transmitted symbols, the echo components have the largest amplitudes and that the non linearities in those components have a large influence on the echo signal, so that for the echo components of the most recently transmitted symbols an echo cancellation signal is formed with the aid of a table, in which also the non-linearities have been taken account of. The echo components caused by the symbols which were transmitted a longer period of time ago have a smaller amplitude and the non-linearities in those components have comparatively little influence on the overall echo signal, so that not compensating for these non-linearities does not deteriorate the echo cancellation to too large an extent. That is why use is made of a transversal filter for producing an echo cancellation signal for the symbols transmitted a longer period of time ago. The complete echo cancellation signal is thereafter obtained by adding together the output signal of the filter with the table structure and the output signal of the transversal filter.

Although a satisfactory echo cancellation signal can be generated with the adaptive filter as described in said European Patent Specification, this filter has the disadvantage that for the first portion of the filter, the portion in which the echo cancellation signal for the most recently transmitted symbols is formed, requires a comparatively large storage capacity in view of the wide amplitude range the correction values for the signals to be compensated for must be able of passing through. In view of the large number of possible correction values, each of the values is utilized to a comparatively little extent and consequently is optimized at a low rate with the aid of the adaptive control, which significantly deteriorates the convergence rate, that is to say the rate at which the filter is capable of producing an optimum echo cancellation signal. In addition, as explained already in the foregoing, a relatively large memory for the table requires expensive chips.

The present invention has for its object to provide an adaptive filter of the above-described type which does not have the above-described disadvantages of the filter in accordance with European Patent Specification No. 092569, for which purpose, according to the invention, M delayed versions of the most recently transmitted symbols are applied to the addressing circuit, than M delayed versions of the most recently transmitted symbols are applied to the weighting and summing arrangement an that M<N.

As according to the invention the filter with the table structure needs to be able to form only the non-linear proportion in the echo cancellation signal for the most recently transmitted symbols, whilst the linear proportion of those symbols in the echo signal is compensated for by means of a weighting and summing arrangement, the correction values in the table need only to be able to pass through a small amplitude range, so that each correction value is relatively often addressed and optimized via the adaptive control loop, so that the convergence rate of the filter with table structure is high, whilst, additionally the required storage room and consequently the chip surface area for this memory may be small.

BRIEF DESCRIPTION OF THE DRAWING

The invention and how it can be put into effect will now be described by way of example on the basis of an embodiment with reference to the accompanying drawing.

DETAILED DESCRIPTION OF THE DRAWING

Herein the Figure shows a block diagram of a conceptual structure of a transceiver system for duplex operation of digital communication over one pair of conductors. In this connection for the sake of completeness, it should be noted that numerous different implementations of the conceptual structure for a transceiver system are possible.

In the transceiver system of the Figure the digital symbols to be transmitted are conveyed via a line 1 to a transmission amplifier 2 at whose output the signal s to be transmitted is available, which signal is coupled to a first terminal of a hybrid circuit 3. Connected to a second terminal of the hybrid circuit 3 is a pair of conductors 4 via which symbols are simultaneously transmitted to and a signal s' received from a different transceiver system, not shown.

The hybrid circuit 3 allows a comparatively strong echo signal e to pass directly from the first terminal to a third terminal, which is coupled to the receiving section of the transmission system. Via this third terminal the signal s'+e is transmitted to an analogue-to-digital converter 5 which converts the signal s'+e, which can be considered as an analogue signal, into a digital signal. This digital signal is coupled to an input terminal of a subtracting circuit 6 to whose other terminal a closest possible approximation ê of the echo signal e is applied in a way still further to be described hereinafter, as the echo cancellation signal, to ensure that at the output of the circuit 6 a signal is available which is as identical as possible to the signal s', which signal is applied to the receiver, not shown, via a line 7.

Although the block circuit diagram includes an analogue-to-digital converter 5, it is alternatively possible to omit this converter and to apply the digital echo cancellation signal ê to circuit 6 via a digital-to-analogue converter, whereas the analogue signal s'+e is directly applied to circuit 6, so that at the output of circuit 6 a signal ŝ is available in the analogue form which can thereafter be sampled and digitized, whereafter the digital signal can be applied to the receiver and to the adaptive control loop which will be described in detail in the sequel.

A non-linear transfer characteristic of the transmit amplifier 2 and/or the hybrid circuit 3 and the analogue-to-digital converter 5, provided this converter is present, is responsible for the fact that the signal e does not only contain a linear portion, which is in a linear relationship with the N previously transmitted symbols, but that the signal e also contains a non-linear portion.

The adaptive filter generating the signal ê is arranged in accordance with the invention for generating an appropriate echo cancellation signal for both the linear portion and the non-linear portion of the echo signal.

In the following description it will be assumed that for generating the echo cancellation signal the influence of N previously transmitted symbols must be taken into account, N being determined experimentally and depending on the specific structure of the transceiver system and on the quality requirements to be satisfied.

The adaptive filter comprises a delay circuit 8, for example a shift register, having N outputs, one of the N previously transmitted symbols being present at each output, the most recently transmitted symbol being present at the first output.

The N inputs of a weighting and summing arrangement 9, which is known per se, are connected to the respective N outputs of the delay circuit 8.

The combination of delay circuit 8 and the weighting and summing arrangement 9 actually constitutes a transversal filter and is capable of supplying from the output of the arrangement 9 a signal which is a linear combination of the N previously transmitted symbols, each of these symbols being multiplied in the weighting and summing arrangement by a specific coefficient, since of course the proportion of a very recently transmitted symbol in the echo compensation signal must be weighted significantly higher than, for example, the influence of the symbol transmitted N periods ago. The coefficients in the weighting and summing arrangement 9 are continuously optimized by means of the adaptive control loop.

The first M (M<N) outputs of the delay circuit 8 are also connected to respective M inputs of an addressing circuit 10 which from the M applied symbols forms an address for a memory 11, for example, a RAM. In this memory an appropriate correction value is stored for each combination of M symbols for the first M symbols in the echo cancellation signal, in principle only a cancellation signal for the nonlinear proportion of the first M symbols in the echo signal being stored in the memory for each of the M symbols.

This is based on the fact that only the non-linearities in the most recent M symbols in the echo signal must be compensated for, since the non-linearities in the symbols M+1 to N, which were transmitted a longer period of time ago, do not have any appreciable influence on the echo signal and consequently need not be cancelled.

The output signal of memory 11, the signal ê and the output signal of the weighting and summing arrangement 9, the signal $ê_{lin}$, are added together in an adder circuit 12 and applied to a subtracting circuit 6 as the echo cancellation signal ê.

In order to continuously optimize the coefficients in the weighting and summing arrangement 9 and the correction values in the memory 11, an adaptive control loop including a circuit 13 is provided in a manner known per se. The mode of operation of such a circuit is known from said article by Verhoecks et al, and is also disclosed in the European Patent Specification No. 0092569.

At four input terminals the circuit 13 receives the signal from line 1, the signal from line 7, the used coefficient value of circuit 9 for the most recently produced correction signal $ê_{lin}$ and the used correction value of memory 11 for the most recently produced correction signal $ê_{nlin}$ respectively. On the basis thereof circuit 13 determines a new sequence of N coefficients for the weighting and summing arrangement 9, and also a new correction value to replace the used correction value in memory 11. As memory 11 needs only to contain a comparatively small number of correction values, the individual correction values in the memory are read relatively often and consequently adapted by means of circuit 13, and since furthermore, the correction values for the non-linear proportion in the echo signal need only be able of passing through a relatively small amplitude range, the convergence rate of the overall filter is high.

As the adaptive control loop simultaneously optimized the coefficients in the weighting and summing arrangement 9 and the correction value in the memory 11, this implies that they are optimized to an aggregate final value, with the result that the memory, as long as it has room for it, can take over a portion of the task of the linear filter, which however is not objectionable in any way.

What is claimed is:

1. An adaptive filter for producing an echo cancellation signal in a transceiver system arranged for duplex digital communication through one single pair of conductors, the filter comprising delay means for receiving and delaying the N most recently transmitted symbols, an addressing circuit coupled to the delay means for always applying to the addressing circuit during a predetermined interval of time the non-delayed and at least one of a predetermined first sequence of delayed versions of the most recently transmitted symbols, the addressing circuit being arranged for forming from the applied signals addresses for a memory which is coupled to the addressing circuit and in which always a first correction signal is stored for each of these addresses, a weighting and summing arrangement coupled to the delay means for always applying to the weighting and summing arrangement during said predetermined interval of time the non-delayed and, from a predetermined second sequence, delayed versions of the most recently transmitted symbols, the weighting and summing arrangement being arranged for multiplying each signal applied thereto by a predetermined specific coefficient for providing during said predetermined interval of time a second correction signal which is the sum of all the signals applied thereto multiplied by their respective specific coefficients, means for adding together the first correction signal and the second correction signal during said predetermined interval of time and means for simultaneously adaptively controlling the coefficients in the weighting and summing arrangement and the correction values in the memory, characterized in that M delayed versions of the most recently transmitted symbols are applied to the addressing circuit while N delayed versions of the most recently transmitted symbols are simultaneously applied to the weighting and summing arrangement and $M<N$.

* * * * *